United States Patent
Chen et al.

(10) Patent No.: US 6,649,991 B1
(45) Date of Patent: Nov. 18, 2003

(54) IMAGE SENSOR SEMICONDUCTOR PACKAGE

(75) Inventors: James Chen, Taipei (TW); Rong-Huei Wang, Hsinchu (TW)

(73) Assignee: Scientek Corp., Hsinchu Shien (TW)

( * ) Notice: Subject to any disclaimer, the term of this patent is extended or adjusted under 35 U.S.C. 154(b) by 0 days.

(21) Appl. No.: 10/128,363

(22) Filed: Apr. 24, 2002

(51) Int. Cl.[7] .................. H01L 23/495; H01L 23/02; H01L 23/31; H01L 27/14; H01L 31/0203

(52) U.S. Cl. ............ 257/433; 257/680; 257/431; 257/434; 257/774; 257/783; 257/737; 257/738; 257/725; 257/291; 257/432; 257/784; 257/786; 257/728

(58) Field of Search .................. 257/738, 737, 257/734, 724, 723, 725, 728, 774, 680, 784, 786, 432, 431, 433, 434, 783, 291

(56) References Cited

U.S. PATENT DOCUMENTS

| | | | |
|---|---|---|---|
| 6,262,479 B1 | * 7/2001 | Chou | 257/704 |
| 6,503,780 B1 | * 1/2003 | Glenn et al. | 438/116 |
| 2002/0060357 A1 | * 5/2002 | Hung et al. | 257/676 |
| 2002/0131782 A1 | * 9/2002 | Yamaguchi et al. | 396/429 |
| 2002/0153581 A1 | * 10/2002 | Lin et al. | 257/433 |
| 2002/0154239 A1 | * 10/2002 | Fujimoto et al. | 348/340 |

FOREIGN PATENT DOCUMENTS

| JP | 61-289772 | * 12/1986 |
|---|---|---|
| JP | 62-273768 | * 11/1987 |
| JP | 2002-100692 | * 9/2000 |

* cited by examiner

Primary Examiner—Alexander O. Williams
(74) Attorney, Agent, or Firm—Rosenberg, Klein & Lee

(57) ABSTRACT

A non-ceramic image sensor semiconductor package with improved moisture resistance, lower cost, higher reliability, and lower profile is provided. A semiconductor chip with a vision chip active area is attached to a multi-layer resin mask organic substrate. A plurality of bonding wires are attached between conductive parts of the semiconductor chip and the multi-layer resin mask organic substrate to create selective electrical connections. A transparent window is placed on top of the semiconductor chip and covers the vision chip active area. A wire shielding block is formed on the multi-layer resin mask organic substrate around the semiconductor chip covering and protecting the bonding wires and the semiconductor chip not covered by the transparent window. A liquid encapsulant is formed to protectively seal the device but does not block the vision of the vision chip active area through the transparent window. Since no space is required between the vision chip active area, and the transparent window, the overall height of the device is reduced. This allows the image sensor semiconductor package of the present invention to be more compact.

22 Claims, 1 Drawing Sheet

IMAGE SENSOR SEMICONDUCTOR PACKAGE

BACKGROUND OF THE INVENTION

1. Field of the Invention

The present invention relates to a semiconductor package. More specifically, the present invention discloses an image sensor semiconductor package comprising a vision chip and a wire shielding block protecting the semiconductor chip bonding wires.

2. Description of the Prior Art

Numerous electronic devices, such as digital cameras, personal digital assistants, and internet appliances, utilize image sensors. As these electronic devices become smaller and smaller, the associated semiconductors used in the electronic devices are forced to become more compact and more efficient. Also, a highly competitive industry and economy is requiring more reliable components at a lower cost.

Image sensors are basically semiconductor devices that are capable of electronically capturing visual information so that this data can be processed or viewed.

As useful as image sensors are, conventional image sensor devices are prone to failure and are relatively expensive to manufacture.

The conventional device basically consists of multiple layers of ceramic material to form a ceramic housing with electrical leads protruding through the sides of the ceramic housing. This ceramic housing is produced by multiple layers of expensive ceramic material. Once a chip has been attached inside the housing, a glass cover is glued to the top of the housing. The glass cover is essentially the same size as the ceramic housing.

The conventional device as described above, has several disadvantages. For example, the glass cover can easily separate from the ceramic package. This is due to the fact that the bond between the glass and ceramic material is not strong. As a result of this delamination, the chip is exposed to the external environment thereby destroying the device.

Ad Another problem is that moisture can enter the porous ceramic package which causes condensation on the inside of the glass thus degrading the image capturing ability and quality of the chip.

Additionally, the ceramic material used in the conventional device is relatively expensive. Requiring multiple layers of expensive ceramic material makes the production cost of the convention device high as well as requiring extra processing steps.

Furthermore, the construction of the conventional ceramic device does not allow for providing the lowest profile or most compact package as possible.

Therefore, there is need for an improved image sensor semiconductor package with improved moisture resistance, lower cost, higher reliability, and more compact profile.

SUMMARY OF THE INVENTION

To achieve these and other advantages and in order to overcome the disadvantages of the conventional device in accordance with the purpose of the invention as embodied and broadly described herein, the present invention provides an image sensor semiconductor package comprising a vision chip and a wire shielding block protecting the semiconductor chip bonding wires with improved moisture resistance higher reliability, lower production cost, and more compact size.

Basically, the image sensor semiconductor device of the present invention comprises a multi-layer resin mask organic substrate, a semiconductor chip, a vision chip active area, conductive wires, a wire shielding block, a transparent window, and encapsulant.

The multi-layer resin mask organic substrate is a substrate comprising a resin mask and an organic substrate of the same material. Utilizing the same materials allows the substrate to be extremely flat. The circuit traces formed by the resin mask that are in the substrate material are even, thus providing a very flat substrate surface. Therefore, there is better placement of the semiconductor chip and greater adhesion between the semiconductor chip and the substrate.

A semiconductor chip is bonded, for example, adhesively bonded, to the multi-layer resin mask organic substrate by means of an adhesive. The semiconductor chip comprises a vision chip active area. The vision chip active area may be comprised as a part of the semiconductor chip or a separate chip. The vision chip may comprise a complementary metal oxide semiconductor (CMOS) or a charge-coupled device (CCD) vision chip.

A plurality of conductive means are bonded or attached between conductive contacts or traces on the active side of the semiconductor chip and the multi-layer resin mask organic substrate. The conductive means comprise, for example, gold bonding wires. The conductive means are utilized to create selective electrical connections between conductive contacts, pads, or traces on the semiconductor chip and traces or contacts of the multi-layer resin mask organic substrate.

A transparent window is placed on top of the semiconductor chip covering the vision chip active area. The transparent window comprises, for example, a boro-silicate glass window, other transparent material, or a lens.

A wire shielding block is formed on the multi-layer resin mask organic substrate around the semiconductor chip. The size of the wire shielding block can be made to a desired height and width so that the bonding wires are covered. The wire shielding block protects the conductive means. While forming the wire shielding block, very low pressure is put on the bonding wires. Therefore, the wires are not distorted. Once formed, the wire shielding block ensures that the wires never touch the chip edge so the semiconductor chip will not be damaged. In addition, the wire shielding block shields the conductive means from the environment or accidental damage before and during encapsulation.

A liquid encapsulant is formed to cover desired areas and portions of the multi-layer resin mask organic substrate, the wire shielding block, and the edges of the transparent window. The encapsulant completely covers the wire shielding block. However, care is taken to ensure that only a portion of the transparent window is covered by the encapsulant. The encapsulant does not cover parts or portions of the transparent window that would cover the vision chip active area thereby interfering with the operation of the vision chip active area. For proper operation, the vision chip active area must be able to have clear vision to the external environment through the transparent window. Therefore, the encapsulant must not block the clear vision of the vision chip active area. The encapsulant adhesively fixes and protectively seals the image sensor semiconductor package thereby shielding the semiconductor chip and vision chip active area from the external environment. Additionally, since the substrate is a resin mask organic substrate and very flat, the adhesion between the substrate and the encapsulant is very strong.

The image sensor semiconductor package can be finished by processing methods to complete the device if needed, prior to or after encapsulation. For example, depending on packaging type, preparing contact areas for inputs and outputs of electrical signals to the semiconductor device. Various package types are provided for in the present invention. For example, the final package type can be a ball grid array (BGA), leadless chip carrier (LCC), quad flat pack (QFP), and quad flat no-lead (QFN) package types, or other package types.

The image sensor semiconductor package of the present invention enjoys numerous advantages and benefits. The flatness of the substrate, the similarity of the materials and properties, and the greater adhesion between materials, provides for a highly reliable and moisture resistant image sensor device. Also, the bonding wires are completely protected by the wire shielding block. The wire shielding block also ensures that the wires never touch the chip edge so the semiconductor chip will not be damaged. In conventional devices, the unprotected wires are often bent or distorted during encapsulation thus increasing the rejection rate. Utilizing the wire shielding block of the present invention allows for an increased yield rate. In addition, the ceramic material of the conventional device is more expensive than the organic material utilized in the image sensor semiconductor device of the present invention. Therefore, an advantage of the present invention is the benefit of reduced production cost. Furthermore, an advantage of the present invention is an extremely low profile. Since no space is required between the semiconductor chip, vision chip active area, and the transparent window, the overall height of the device is reduced. This allows the image sensor semiconductor package of the present invention to be more compact thereby increasing the value of the device.

Therefore, the present invention provides an image sensor semiconductor package comprising a vision chip and wire shielding block with improved moisture resistance, lower cost, higher reliability, and more compact size.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawing is included to provide a further understanding of the invention, and is incorporated in and constitutes a part of this specification. The drawing illustrates an embodiment of the invention and, together with the description, serves to explain the principles of the invention. In the drawing.

DESCRIPTION OF THE PREFERRED EMBODIMENTS

Figure 1:
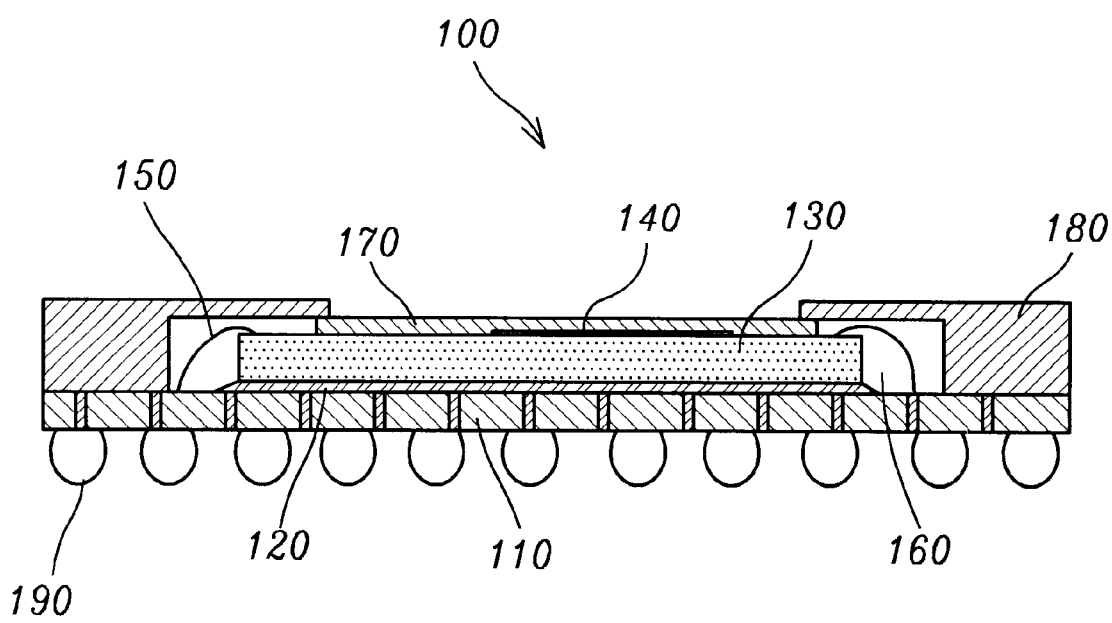
FIG. 1 is a sectional view showing the construction of an image sensor semiconductor package in accordance to an embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

As described above, the conventional ceramic image sensor device has several disadvantages. For example, the ceramic material used in producing the device is relatively expensive. In addition, moisture can enter the device causing condensation to form inside the part thus degrading the image sensing performance of the device. Furthermore, the glass cover can easily separate from the ceramic package as it is only held onto the ceramic package with glue. As a result, the chip can become exposed to the external environment thereby destroying the device.

However, the present invention provides an image sensor semiconductor package with improved moisture resistance, lower cost, higher reliability, and more compact size.

Refer to FIG. 1, which is a sectional view showing the construction of an image sensor semiconductor package in accordance to an embodiment of the present invention.

The image sensor semiconductor device 100 comprises a multi-layer resin mask organic substrate 110, a semiconductor chip 130, a vision chip active area 140, conductive wires 150, a wire shielding block 160, a transparent window 170, and encapsulant 180.

The multi-layer resin mask organic substrate 110 is a substrate comprising a resin mask and an organic substrate of the same material. Utilizing the same materials allows the substrate to be extremely flat. The circuit traces formed by the resin mask that are in the substrate material are even, thus providing a very flat substrate surface. Therefore, there is better placement of the semiconductor chip 130 and greater adhesion between the semiconductor chip 130 and the substrate 110.

In contrast, other types of substrates are often inferior as the resultant substrates are often not flat. In these substrates, the traces are raised slightly above the substrate material, making the face of the substrate uneven and not flat. As a result, in an integrated circuit using other types of substrates, the physical and mechanical properties such as adhesion between the semiconductor chip and the substrate, are inferior. In addition, many conventional substrates tend to absorb too much moisture. As a result, reliability problems are encountered in these devices.

Note, in this embodiment of the present invention, the resin mask organic substrate is multi-layered. However, a single layer resin mask organic substrate is disclosed in other embodiments of the present invention.

A semiconductor chip 130 is bonded, for example, adhesively bonded, to the multi-layer resin mask organic substrate 110 by means of an adhesive 120. Note that for clarity only one semiconductor chip is given by way of example. In other embodiments of the present invention, multiple semiconductor chips are utilized within the same semiconductor package.

The semiconductor chip 130 comprises a vision chip active area 140. The vision chip active area may be comprised as a part of the semiconductor chip 130 or a separate chip. The vision chip 140 comprises, for example, a complementary metal oxide semiconductor (CMOS) or a charge-coupled device (CCD) vision chip.

A plurality of conductive means 150 are bonded or attached between conductive contacts or traces on the active side of the semiconductor chip 130 and the multi-layer resin mask organic substrate 110. The conductive means 150 comprise, for example, gold bonding wires.

The conductive means 150 are utilized to create selective electrical connections between conductive contacts, pads, or traces on the semiconductor chip 130 and traces or contacts of the multi-layer resin mask organic substrate 110.

A transparent window 170 is placed on top of the semiconductor chip 130 covering the vision chip active area 140. The transparent window 170 comprises, for example, a boro-silicate glass window, other transparent material, or a lens.

A wire shielding block 160 is formed on the multi-layer resin mask organic substrate around the semiconductor chip 130. The size of the wire shielding block 160 can be made to a desired height and width so that the bonding wires are covered.

The wire shielding block protects the conductive means. While forming the wire shielding block, very low pressure is put on the bonding wires. Therefore, the wires are not distorted. Once formed, the wire shielding block ensures that the wires never touch the chip edge so the semiconductor chip will not be damaged. In addition, the wire shielding block shields the conductive means from the environment or accidental damage before and during encapsulation.

In an embodiment of the present invention, the transparent window is placed on the semiconductor chip and the wire shielding block is formed, in the same production process step. Thereby saving production time, eliminates processing steps, and lowers manufacturing costs. In this way, the wire shielding block assists in holding the transparent window in place or position. This is a particularly useful advantage prior to encapsulation.

The wire shielding block 160 is made of, for example, resin substrate material or elastomer. An advantage of the present invention is that by using a material for the wire shielding block 160 that is the same or similar to the material of the organic substrate 110, the physical properties of the two will be similar thereby making the adhesion stronger between the organic substrate 110 and the wire shielding block 160. As a result, the reliability of the device is increased.

A liquid encapsulant 180 is formed to cover desired areas and portions of the multi-layer resin mask organic substrate 110, the wire shielding block 160, and the edges of the transparent window 170. The encapsulant 180 completely covers the wire shielding block 160. However, care is taken to ensure that only a portion of the transparent window 170 is covered by the encapsulant 180. The encapsulant 180 does not cover parts or portions of the transparent window 170 that would cover the vision chip active area 140 thereby interfering with the operation of the vision chip active area 140. For proper operation, the vision chip active area 140 must be able to have clear vision to the external environment through the transparent window 170. Therefore, the encapsulant 180 must not block the clear vision of the vision chip active area 140.

The encapsulant 180 is formed by, for example, printing or molding. The encapsulant 180 adhesively fixes and protectively seals the image sensor semiconductor package 100 thereby shielding the semiconductor chip 130 and vision chip active area 140 from the external environment. Additionally, since the substrate 110 is a resin mask organic substrate and very flat, the adhesion between the substrate 110 and the encapsulant 180 is very strong.

The image sensor semiconductor package can be finished by processing methods to complete the device if needed, prior to or after encapsulation. For example depending on packaging type, preparing contact areas for inputs and outputs of electrical signals to the semiconductor device. For example, as shown in FIG. 1, in an embodiment of the present invention, solder balls 190 are attached to the bottom of the multi-layer resin mask organic substrate 110 to form a ball grid array (BGA) semiconductor package.

A plurality of solder balls 190 are formed which are electrically connected to A conductive traces or portions of the multi-layer resin mask organic substrate 110. The solder balls 190 are formed from, for example, Pb, Sn, or other conductive material. The solder balls 190 act as electrodes of the semiconductor device 100 and allow flow of input and output signals between the semiconductor chip 130 and the printed circuit boards, frames, or devices to which the semiconductor device 100 is electrically connected.

Although the embodiment shown above comprises a particular type of package, other package types are used in other embodiments of the present invention. For example, in embodiments of the present invention the package type is ball grid array (BGA), leadless chip carrier (LCC), quad flat pack (QFP), and quad flat no-lead (QFN) package types, or other package types.

A major concern with image sensor semiconductor devices is moisture resistance. If moisture is allowed to enter the device, condensation will form on the glass window, semiconductor chip, or vision chip active area. Conventional devices are susceptible to such moisture problems. However, in the present invention, the flatness of the substrate, the similarity of the materials and properties, and the greater adhesion between materials, provides for a highly reliable and moisture resistant image sensor device.

Also, the bonding wires are completely protected by the wire shielding block. While forming the wire shielding block, very low pressure is put on the bonding wires. Therefore, the wires are not distorted. The wire shielding block also ensures that the wires never touch the chip edge so the semiconductor chip will not be damaged. In conventional devices, the unprotected wires are often bent or distorted during encapsulation thus increasing the rejection rate. Utilizing the wire shielding block of the present invention allows for an increased yield rate.

In addition, the ceramic material of the conventional device is more expensive than the organic material utilized in the image sensor semiconductor device of the present invention. The conventional device requires multiple layers of expensive ceramic material which makes the production cost of the convention device high as well as requiring extra processing steps. Therefore, an advantage of the present invention is the benefit of reduced production cost.

Furthermore, an advantage of the present invention is an extremely low profile. Since no space is required between the semiconductor chip, vision chip active area, and the transparent window, the overall height of the device is reduced. This allows the image sensor semiconductor package of the present invention to be more compact thereby increasing the value of the device.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An image sensor semiconductor package comprising:
   a substrate formed of a resin mask organic material comprising a plurality of conductive traces;
   a semiconductor chip comprising a vision chip active area attached to the resin mask organic substrate;
   a plurality of conductive members electrically coupled to conductive portions of the semiconductor chip and the conductive traces of the resin mask organic substrate;

a transparent window extending over the semiconductor chip and the vision chip active area;

a wire shielding block formed on the resin mask organic substrate around the semiconductor chip, the wire shielding block covering at least one of the plurality of conductive members and being peripherally offset relative to the transparent window; and an encapsulant covering selected areas of the resin mask organic substrate, the wire shielding block and edges of the transparent window, the encapsulant overlapping a peripheral portion of the transparent window.

2. The image sensor semiconductor package of claim 1, whereby the plurality of conductive means comprises bonding wires.

3. The image sensor semiconductor package of claim 1, whereby the resin mask organic substrate comprises a multi-layer resin mask organic substrate.

4. The image sensor semiconductor package of claim 1, whereby the wire shielding block and the resin mask organic substrate comprise the same material.

5. The image sensor semiconductor package of claim 1, whereby the transparent window is glass.

6. The image sensor semiconductor package of claim 1, whereby the transparent window comprises a lens.

7. The image sensor semiconductor package of claim 1, whereby the semiconductor chip comprises a complementary metal oxide semiconductor vision chip.

8. The image sensor semiconductor package of claim 1, whereby the semiconductor chip comprises a charge-coupled device vision chip.

9. The image sensor semiconductor package of claim 1, whereby the package type is a quad flat no-lead package type.

10. The image sensor semiconductor package of claim 1, whereby the package type is a leadless chip carrier package type.

11. The image sensor semiconductor package of claim 1, whereby the package type is a ball grid array package type.

12. The image sensor semiconductor package of claim 1, whereby the semiconductor package comprises a plurality of semiconductor chips.

13. An image sensor semiconductor package comprising;

a multi-layer substrate formed of a resin mask organic material, a plurality of conductive traces being formed in the resin mask organic substrate forming a circuit pattern;

a semiconductor chip adhesively bonded to the multi-layer resin mask organic substrate, the semiconductor chip including a vision chip active area;

a plurality of bonding wires respectively coupled to conductive portions of the semiconductor chip and the traces in the multi-layer resin mask organic substrate;

a transparent window covering at least the vision chip active area; and a wire shielding block formed on the multi-layer resin mask organic substrate around the semiconductor chip, the wire shielding block covering at least one of the plurality of bonding wires and being peripherally offset relative to the transparent window; and an encapsulant covering selected areas of the multi-layer resin mask organic substrate, the wire shielding block and edges of the transparent window, the encapsulant overlapping a peripheral portion of the transparent window;

whereby the encapsulant protectively seals the image sensor semiconductor package.

14. The image sensor semiconductor package of claim 13, whereby the wire shielding block and the multi-layer resin mask organic substrate comprise the same material.

15. The image sensor semiconductor package of claim 13, whereby the transparent window is glass.

16. The image sensor semiconductor package of claim 13, whereby the transparent window comprises a lens.

17. The image sensor semiconductor package of claim 13, whereby the semiconductor chip comprises a complementary metal oxide semiconductor vision chip.

18. The image sensor semiconductor package of claim 13, whereby the semiconductor chip comprises a charge-coupled device vision chip.

19. The image sensor semiconductor package of claim 13, whereby the package type is a quad flat no-lead package type.

20. The image sensor semiconductor package of claim 13, whereby the package type is a leadless chip carrier package type.

21. The image sensor semiconductor package of claim 13, whereby the package type is a ball grid array package type.

22. The image sensor semiconductor package of claim 13, whereby the semiconductor package comprises a plurality of semiconductor chips.

* * * * *